(12) United States Patent
Rapp et al.

(10) Patent No.: US 7,697,640 B2
(45) Date of Patent: Apr. 13, 2010

(54) METHOD FOR ADAPTIVE BIT RECOVERY

(75) Inventors: Stefan Rapp, Schramberg (DE); Axel Kochale, Springe (DE)

(73) Assignee: Thomson Licensing, Issy les Moulineaux (FR)

( * ) Notice: Subject to any disclaimer, the term of this patent is extended or adjusted under 35 U.S.C. 154(b) by 1055 days.

(21) Appl. No.: 10/875,493

(22) Filed: Jun. 24, 2004

(65) Prior Publication Data

US 2005/0008102 A1    Jan. 13, 2005

(30) Foreign Application Priority Data

Jul. 9, 2003    (EP) .................................. 03015702

(51) Int. Cl.
*H04L 27/06* (2006.01)
(52) U.S. Cl. ...................... 375/340; 375/341; 375/232; 369/59.22; 369/59.27; 369/53.45
(58) Field of Classification Search ................ 375/340, 375/350, 232–234, 341, 229, 269, 279, 362, 375/355, 308, 334; 714/794, 795; 360/25, 360/30.07, 30.22, 44.27, 44.29, 47.39, 53.16, 360/53.33, 53.37, 59.11; 708/300, 25, 534; 369/14–18, 13.56, 13.02, 30.08, 44, 44.26, 369/44.35, 44.41, 47, 39, 53.37, 53.45, 59, 369/22, 59.27
See application file for complete search history.

(56) References Cited

U.S. PATENT DOCUMENTS

| | | | |
|---|---|---|---|
| 5,285,480 A | 2/1994 | Chennakeshu et al. | 375/96 |
| 5,353,307 A * | 10/1994 | Lester et al. | 375/233 |
| 5,517,476 A | 5/1996 | Hayashi | |
| 5,533,067 A | 7/1996 | Jamal et al. | 375/341 |
| 5,727,032 A | 3/1998 | Jamal et al. | 375/347 |
| 5,901,128 A | 5/1999 | Hayashi et al. | 369/59 |
| 6,515,812 B1 * | 2/2003 | Bergmans et al. | 360/48 |
| 2002/0067677 A1 | 6/2002 | Miyashita et al. | |

FOREIGN PATENT DOCUMENTS

| | | |
|---|---|---|
| EP | 0 294 116 A2 | 5/1988 |
| EP | 0 822 673 A1 | 7/1997 |
| EP | 0 940 811 A1 | 3/1999 |

(Continued)

OTHER PUBLICATIONS

Yashimi Tomita, et al.,"25GB read-only disk system using the two-dimensional equalizer", 2001, the Japan Society of applied science, vol. 40 pp. 1716-1722.*

(Continued)

*Primary Examiner*—David C Payne
*Assistant Examiner*—Rahel Guarino
(74) *Attorney, Agent, or Firm*—Robert D. Shedd; Joseph J. Opalach

(57) ABSTRACT

A method for bit recovery in a data channel includes the steps of: inputting a read channel signal, providing a main signal processor for adaptive bit recovery from the read channel signal, providing an auxiliary signal processor for bit recovery from the read channel signal, using an output of the auxiliary signal processor for adaptation of the main signal processor, and outputting a recovered binary bit stream.

10 Claims, 1 Drawing Sheet

FOREIGN PATENT DOCUMENTS

| | | | |
|---|---|---|---|
| EP | 1 014 363 | A2 | 12/1999 |
| EP | 1014363 | A2 * | 6/2000 |
| EP | 0940811 | B1 | 8/2004 |
| EP | 0644661 | B1 | 6/2008 |
| JP | 10-241296 | | 9/1998 |
| JP | 2003-123402 | | 4/2003 |

OTHER PUBLICATIONS

Hangyu Cho et al., "Combining Nonlinear Equalization and Simple Detection for High-Density Optical Recording Channels" Sep. 2002, IEEE Transactions On Magnetics vol. 38, No. 5 XP-002237636.

Shintaro Takehara et al., "Combined Adaptive Controlled PRML Signal Processing For High-Density Optical Disk" IEEE 0-7803-7379-0/02/ © 2002 Shintaro Takehara et al.

Adaptive Partial-Response Maximum-Likelhood Detection In Optical Recording Media etc.: IEEE 0-2803-7379-0/02 © 2002.

Experimental Study Of 30GB/Side Rewritable Optical Disk Using A Blue-Laser Diode IEEE 0-7803-7379-0/02 © 2002 Maho Kuwahara et al.

Translation for JP2003-123402. Toshiba Corp. Apr. 25, 2003.

Translation for JP10-241296. Sony Corp. Sep. 11, 1998.

* cited by examiner

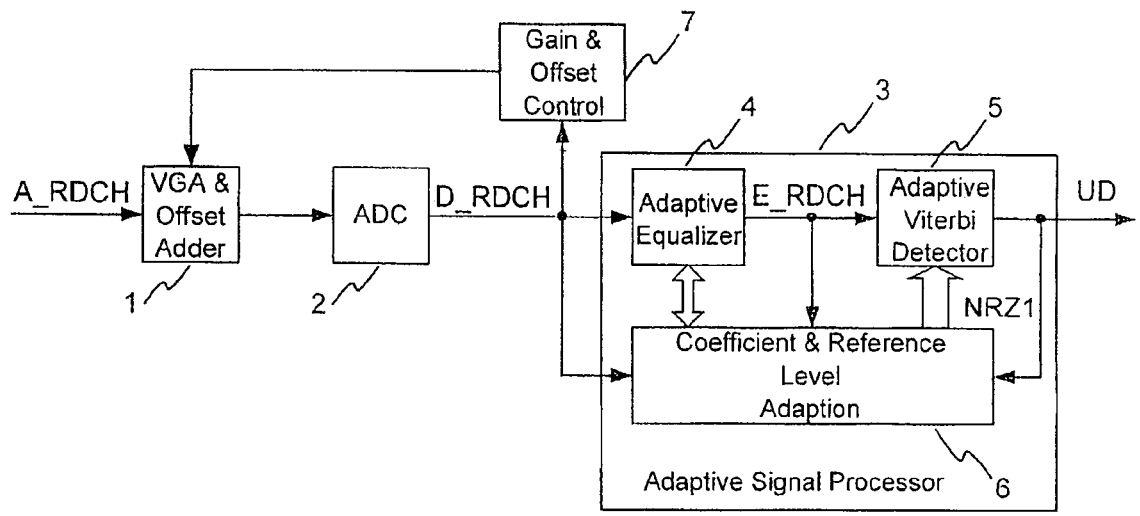
Fig. 1 -- Prior Art --
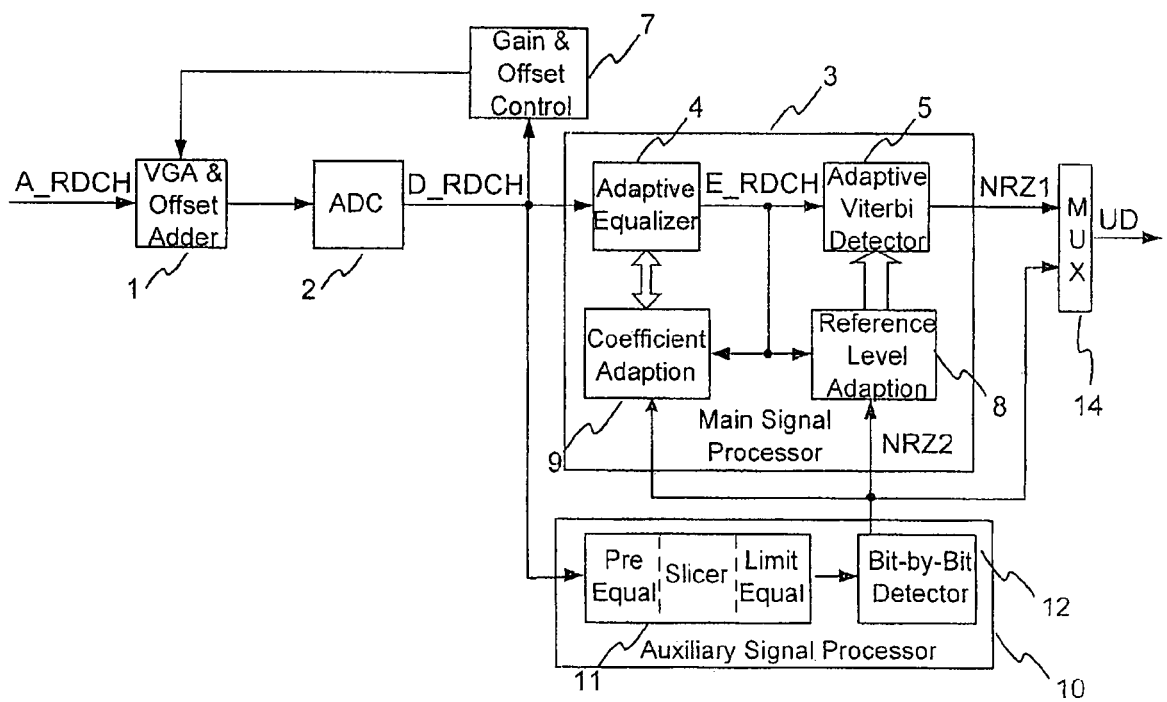
Fig. 2

METHOD FOR ADAPTIVE BIT RECOVERY

FIELD OF THE INVENTION

The present invention relates to a method and a device for bit recovery in a deteriorated data channel, and to an apparatus for reading from and/or writing to recording media using such method or device.

BACKGROUND OF THE INVENTION

In many of today's applications large amounts of data need to be stored. In the area of Personal Computers and in addition in the area of consumer electronics harddisks as fixed storage media and optical disks as removable storage media are commonly used for this purpose. Due to emerging incremental data bandwidth needs (HDTV, fast copy) the data throughput of the applications is increasing continuously. Consequently, the corresponding disk devices have to provide the appropriate data and data bandwidth, too. Therefore, a plurality of high density optical recording media have been developed, e.g. the Digital Versatile Disk (DVD) or the Blu-Ray Disk (BD) using blue laser light for reading and recording.

The readout signal from such high density optical disks is deteriorated mainly by two factors. The first factor is the small ratio between the amplitudes of the shortest run-length symbols and the longest run-length symbols (e.g. the I2/I8 ratio in the case of Blu-Ray disks), which is caused by the high information density, i.e. the ratio between the diameter of the laser spot and the physical length of a channel bit. This ratio is time-variant due to effects like disk tilt or de-focusing. The second factor is the waveform asymmetry, which is caused by an unequal length of the pits and lands due to recording and/or mastering imperfections. This asymmetry is also known as domain bloom.

In "Combined Adaptive Controlled Partial Response and Maximum Likelihood Signal Processing for High-Density Optical Disks", Jpn. J. Appl. Phys. Vol. 42 (2003), pp. 924-930, Takehara et al. propose to use both an adaptive equalizer and a Viterbi detector with adaptive reference levels in order to allow a highly reliable recovery of the stored user data. However, both adaptation schemes rely on the recovered bit stream and are in fact gain control loops. Therefore, the adaptation is difficult to control and tends to instability. Furthermore, this detector arrangement has problems at start-up, i.e. it needs a proper pre-setting of all coefficients and a complicated range checking during the adaptation process. Finally, an additional automatic gain control loop, which is also necessarily present, forms a third loop which modifies the gain.

It is an object of the invention to propose an improved method for adaptive bit recovery.

SUMMARY OF THE INVENTION

According to the invention, a method for bit recovery in a data channel comprises the steps of:
inputting a read channel signal;
providing a main signal processor for adaptive bit recovery from the read channel signal;
providing an auxiliary signal processor for bit recovery from the read channel signal;
using an output of the auxiliary signal processor for adaptation of the main signal processor; and
outputting a recovered binary bit stream.

The bit stream for the adaptation circuits is generated by an additional, more simple but very robust signal processor. In this way the interacting control loops are decoupled. Start-up problems are avoided since the auxiliary signal processor delivers an acceptable bit error rate for the adaptation of the main signal processor without any adjustment. This adaptation is basically a low-pass filtering process and is hence not strongly affected by occasional bit errors.

Favourably, an adaptive equalizer and an adaptive detector are used for the main signal processor. This allows a highly reliable recovery of the stored user data even if the read channel signal is disturbed by the high information density, by effects like disk tilt or de-focusing, or by signal asymmetry.

Advantageously, the adaptive equalizer has different middle coefficients for mark, zero and space. This allows to compensate a possible asymmetry in the read channel signal very well. In known systems different coefficients are only used for mark and space. Using different middle coefficients for mark, zero and space is not limited to the present invention, it can also be employed for improving the method known from prior art as described above or other methods.

According to a further aspect of the invention, the data stream from the main signal processor is used for fine-adaptation of the main signal processor. Though this fine adaptation is not necessary under standard conditions, it might be advantageous for further improving the signal quality or the operation speed.

According to a refinement of the invention, the data stream from the auxiliary signal processor is used as the recovered binary bit stream until the output from the main signal processor is reliable. In this case a multiplexer is used for choosing the appropriate signal depending on the adaptation. Using the data stream from the auxiliary signal processor as the recovered binary bit stream reduces the time needed until an output signal is obtained from the circuit arrangement after start-up.

Favourably, the data stream from the auxiliary signal processor is used as the recovered binary bit stream for high-speed operation. For high-speed read operation, the main signal processor might be too slow due to its complicated processing. In this case the data stream coming from the auxiliary signal processor is used. Since high-speed operation is only possible with a good signal quality, this signal processor is sufficient in this case. A multiplexer is used for choosing either the data stream from the auxiliary signal processor or the data stream from the main signal processor depending on the operation mode.

Advantageously a limit equalizer block and a bit-by-bit detector is used for the auxiliary signal processor. This type of signal processor is well known. Although the bit error rate delivered by this auxiliary signal processor is not as good as the bit error rate of the main signal processor after proper adaptation of the equalizer coefficients and the Viterbi detector reference levels, it is still sufficient for the adaptation of the main signal processor.

Favourably, a slicer is inserted between a pre-equalizer and a limit equalizer of the limit equalizer block of the auxiliary signal processor. Since a limit equalizer is very susceptible to signal asymmetry, the insertion of such an additional slicer results in a significant performance improvement in case of strong asymmetry.

According to the invention, a device for bit recovery in a data channel comprises:
an input for inputting a read channel signal;
a main signal processor for adaptive bit recovery from the read channel signal;

an auxiliary signal processor for bit recovery from the read channel signal, whereby an output of the auxiliary signal processor is used for adaptation of the main signal processor; and an output for outputting a recovered binary bit stream.

Such a device is well suited for performing a method according to the invention. Favourably, the main signal processor comprises an adaptive equalizer and an adaptive detector, which allows a highly reliable recovery of the stored user data. In order to compensate a possible asymmetry in the read channel signal, the adaptive equalizer advantageously has different middle coefficients for mark, zero and space.

Favourably, the auxiliary signal processor comprises a limit equalizer block and a bit-by-bit detector. Although this auxiliary signal processor has an increased bit error rate compared with the bit error rate of the main signal processor after proper adaptation, it is still sufficient for the adaptation of the main signal processor. By providing a slicer between a pre-equalizer and a limit equalizer of the limit equalizer block, a significant performance improvement in case of strong asymmetry is achieved.

According to a further aspect of the invention, an apparatus for reading from and/or writing to recording media uses a method according to the invention or comprises a device according to the invention for bit recovery in a data channel. Favourably, the apparatus is used for reading from and/or writing to optical recording media. However, the invention is not limited to these types of recording media.

BRIEF DESCRIPTION OF THE DRAWINGS

For a better understanding of the invention, an exemplary embodiment is specified in the following description with reference to the figures. It is understood that the invention is not limited to this exemplary embodiment and that specified features can also expediently be combined and/or modified without departing from the scope of the present invention. In the figures:

FIG. 1 shows an arrangement of an adaptive detector; and

FIG. 2 shows a detector arrangement according to the invention.

DETAILED DESCRIPTION OF PREFERED EMBODIMENTS

In FIG. 1 an arrangement of an adaptive signal processor 3 is shown. An analog read channel signal A_RDCH, which is a summation of the four quadrants of a photo detector (not shown in the figure), is first processed by a variable gain amplifier and offset adder block 1. The variable gain amplifier is an amplifier with a controllable gain factor. The analog signal A_RDCH coming from the recording medium varies both in amplitude and in offset, e.g. due to fingerprints or scratches. The adaptive signal processor 3, however, delivers the best performance, i.e. the lowest bit error rate, when the input signal is constant both in amplitude and offset. Therefore, a gain and offset control block 7 varies the gain of the variable gain amplifier and adds an offset to the input signal A_RDCH. The gain- and offset-corrected signal is digitised by an analog-to-digital converter 2 to obtain a digitised read channel signal D_RDCH. This digitised read channel signal D_RDCH is input to the gain and offset control block 7 to form a closed loop. The analog-to-digital converter 2 is either clocked with a varying clock synchronous with the bit stream coming from the recording medium or asynchronously at a fixed clock rate. In the latter case the signal is re-sampled by a sample rate converter (not shown). For the sake of simplicity, the whole phase locked loop is omitted in the figure. In either case the digitised read channel signal D_RDCH after the analog-to-digital converter 2 is synchronous with the channel bit clock and more or less constant in amplitude and offset due to the gain and offset control loop.

The digitised read channel signal D_RDCH is modified by an adaptive equalizer 4 and converted to a binary data stream UD by an adaptive Viterbi detector 5 for further processing. The adaptive equalizer 4 changes the waveform of the incoming signal D_RDCH so that it resembles as much as possible a partial-response target waveform. The equalizer 4 is made adaptive since the frequency characteristic of the incoming signal D_RDCH differs for different recording media, for different recordings, or even during the playback of one recording medium due to changes in reflectivity. The coefficients for the equalizer 4 are calculated by a coefficient and reference level adaptation block 6, which favourably is a hardware implementation of the well known least-mean-square algorithm. In fact this is a feedback control system with the output signal E_RDCH of the equalizer 4, i.e. the equalized read channel signal, as the actual value. The necessary target value is derived from the recovered binary bit stream UD, i.e. the output from the adaptive Viterbi detector 5. This bit stream UD is converted to the partial response target waveform with a finite impulse response filter, the so-called target filter. The equalized signal E_RDCH is delivered to the adaptive Viterbi detector 5, which in principal corresponds to a well-known Viterbi detector. The main problem of Viterbi detection for optical storage channels is an asymmetry of the eye-pattern. Therefore, the reference levels of the Viterbi detector 5 are not fixed, but are obtained from the coefficient and reference level adaptation block 6. This is described in more detail by Ide in "Adaptive Partial-Response Maximum-Likelihood Detection in Optical Recording Media", Jpn. J. Appl. Phys. Vol. 41 (2002), pp. 1789-1790. The coefficient and reference level adaptation block 6 adapts the reference levels based on the recovered binary bit stream NRZ1, i.e. the output of the adaptive Viterbi detector 5. Of course, the variable gain amplifier and offset adder block 1, the analog-to-digital converter 2, and the gain and offset control block 7 can also be included in the signal processor 3.

FIG. 2 shows a detector arrangement according to the invention. The arrangement corresponds largely to the arrangement shown in FIG. 1. However, in the signal processor 3 the coefficient and reference level adaptation block 6 is divided into a coefficient adaptation block 9 and a reference level adaptation block 8. The main difference is that an additional bit stream NRZ2 for the adaptation circuits is generated by an additional, more simple but very robust auxiliary signal processor 10. This auxiliary signal processor 10 comprises a limit equalizer block 11 and a succeeding bit-by-bit detector 12, which favourably is a threshold detector. Since a limit equalizer is very susceptible to signal asymmetry, an additional slicer is inserted between a pre-equalizer and the actual limit equalizer in the limit equalizer block 11. This results in a significant performance improvement in case of strong asymmetry. Although the bit error rate delivered by the auxiliary signal processor 10 is not as good as the bit error rate from the main signal processor 3 after proper adjustment of the equalizer coefficients and the Viterbi detector reference levels, it is still sufficient for the adaptation of the main signal processor 3, since this adaptation is basically a low-pass filtering process and is hence not strongly affected by occasional bit errors. Of course, as in FIG. 1 it is also possible to use the output NRZ1 of the main signal processor 3 for fine adaptation of the main signal processor 3 after a preliminary adaptation based on the output NRZ2 of the auxiliary signal processor 10.

For high-speed read operation, the main signal processor 3 might be too slow due to its complicated processing. In this case the data stream NRZ2 coming from the auxiliary signal processor 10 is advantageously used as the user data output signal UD. Since high-speed operation is only possible with a sufficient signal quality, this signal processor 10 is satisfactory in this case. A multiplexer 14 is used for choosing either the data stream NRZ2 from the auxiliary signal processor 10 or the data stream NRZ1 from the main signal processor 3 depending on the operation mode. Of course, this approach is also applicable if an increased bit error rate can be tolerated.

Favourably, the Viterbi detector 5 has a constraint length of 3 and a path memory length of 16. For recording media of the Blu-ray disk type the partial-response equalization adaptation is either done for PR(1,2,2,1) or for PR(2,3,3,2). PR(1,2,2,1) has the advantage that the target levels are evenly spaced. However, a stronger boost of the 2T symbols is needed in this case than for PR(2,3,3,2), i.e. 13 dB instead of 10 dB for a worst case 25 GByte Blu-ray disk with an I2 pp/I8 pp ratio of 5%. PR(2,3,3,2) on the other hand needs a stronger boost at higher frequency and has the drawback that the target levels are not evenly spaced. For DVD, PR(1,1,1,1) is advantageously used.

The equalizer 4 consists of a symmetrical finite impulse response filter with seven or more taps and a least-mean-square coefficient adaptation. The centre tap favourably has separated coefficients for mark, zero and space, which compensates the asymmetry very well.

What is claimed is:

1. A method for bit recovery in a data channel comprising the steps of:
   using a main signal processor in a first signal path for adaptive bit recovery from an input signal;
   using an auxiliary signal processor in a second signal path in parallel to the first signal path having a limit equalizer and a bit-by-bit detector for performing bit recovery from the input signal in parallel to the main signal processor;
   using an output of the auxiliary signal processor for adaptation of the main signal processor for avoiding start up problems of the adaptive bit recovery; and,
   outputting a recovered binary bit stream either from the main signal processor or from the auxiliary signal processor, wherein the data stream from the auxiliary signal processor is used as the recovered binary bit stream until the output from the main signal processor is reliable.

2. The method according to claim 1, further including the step of using an adaptive equalizer and an adaptive detector for the main signal processor.

3. The method according to claim 1, further including the step of using the data stream from the main signal processor for fine-adaptation of the main signal processor.

4. The method according to claim 1, further including the step of using the data stream from the auxiliary signal processor as the recovered binary bit stream for high-speed operation.

5. The method according to claim 1, further including the step of using a slicer between a pre-equalizer and a limit equalizer of the limit equalizer block of the auxiliary signal processor.

6. A device for bit recovery in a data channel comprising:
   a main signal processor for adaptive bit recovery from an input signal providing a first signal path;
   an auxiliary signal processor having a limit equalizer and a bit-by-bit detector performing bit recovery from the input signal in parallel to the main signal processor providing a second signal path in parallel to the first signal path;
   an output of the auxiliary signal processor being used for adaptation of the main signal processor to avoid start up problems of the adaptive bit recovery; and
   an output outputting a recovered binary bit stream either from the main signal processor or from the auxiliary signal processor, wherein the data stream from the auxiliary signal processor is used as the recovered binary bit stream until the output from the main signal processor is reliable.

7. The device according to claim 6, characterized in that the main signal processor includes an adaptive equalizer and an adaptive detector.

8. The device according to claim 6, wherein a slicer is provided between a pre-equalizer and a limit equalizer of the limit equalizer block of the auxiliary signal processor.

9. The device according to claim 6 wherein the device is a part of an apparatus for reading from and/or writing to recording media.

10. Method for bit recovery in a data channel comprising:
    using a main signal processor in a first signal path for adaptive bit recovery from an input signal;
    using an auxiliary signal processor in a second signal path in parallel to the first signal path having a limit equalizer and a bit-by-bit detector for performing bit recovery from the input signal in parallel to the main signal processor;
    including a slicer between a pre-equalizer and a limit equalizer of the limit equalizer block of the auxiliary signal processor; and,
    using an output of the auxiliary signal processor for adaptation of the main signal processor for avoiding start up problems of the adaptive bit recovery.

* * * * *